(12) United States Patent
Hsu et al.

(10) Patent No.: US 9,666,429 B1
(45) Date of Patent: May 30, 2017

(54) METHOD FOR GROWING GROUP III NITRIDE

(71) Applicant: EPILEDS TECHNOLOGIES, INC., Tainan (TW)

(72) Inventors: Kung-Hsieh Hsu, Tainan (TW); Ming-Sen Hsu, Tainan (TW)

(73) Assignee: EPILEDS TECHNOLOGIES, INC., Tainan (TW)

( * ) Notice: Subject to any disclaimer, the term of this patent is extended or adjusted under 35 U.S.C. 154(b) by 0 days.

(21) Appl. No.: 15/171,774

(22) Filed: Jun. 2, 2016

(30) Foreign Application Priority Data

Feb. 3, 2016 (TW) .............................. 105103492 A

(51) Int. Cl.
*H01L 21/02* (2006.01)
*H01L 33/00* (2010.01)

(52) U.S. Cl.
CPC ...... *H01L 21/0243* (2013.01); *H01L 21/0254* (2013.01); *H01L 21/0262* (2013.01); *H01L 21/02458* (2013.01); *H01L 21/02631* (2013.01); *H01L 21/02647* (2013.01); *H01L 33/0066* (2013.01); *H01L 33/0075* (2013.01)

(58) Field of Classification Search
CPC ............. H01L 21/02518; H01L 21/461; H01L 21/4763; H01L 21/64; H01L 21/70; H01L 21/702; H01L 21/71
See application file for complete search history.

(56) References Cited

U.S. PATENT DOCUMENTS

2002/0022287 A1* 2/2002 Linthicum .......... H01L 21/0237
438/46

* cited by examiner

*Primary Examiner* — Cheung Lee
(74) *Attorney, Agent, or Firm* — Muncy, Geissler, Olds & Lowe, P.C.

(57) ABSTRACT

A method for growing Group III nitride is provided, which includes the following steps. A plurality of notches separated from each other are formed at the epitaxial substrate surface via the pattering process. The plurality of notches each has at least one stepping structure with a predetermined inclination angle, wherein the stepping structure in each notch gradually descends towards the center of the corresponding notch. The Group III nitride is grown on the epitaxial substrate via epitaxy process. Wherein, the Group III nitride growing at an upper portion of the epitaxial substrate restricts the vertical growth of the Group III nitride growing at the lower portion of the epitaxial substrate, and the Group III nitride growing at the lower portion of the epitaxial substrate promotes the lateral growth of the Group III nitride growing at the upper portion of the epitaxial substrate.

11 Claims, 14 Drawing Sheets

METHOD FOR GROWING GROUP III NITRIDE

CROSS-REFERENCE TO RELATED APPLICATION

This application claims priority from Taiwan Patent Application No. 105103492, filed on Feb. 3, 2016, in the Taiwan Intellectual Property Office, the content of which is hereby incorporated by reference in their entirety for all purposes.

BACKGROUND OF THE INVENTION

1. Field of the Invention

The present invention relates to a method for growing Group III nitride; more particularly, the present invention relates to a method for growing Group III nitride which is applicable to the light emitting diode.

2. Description of the Related Art

In recent years, the Group III nitride is gaining prominence in the global semiconductor industry, due to the direct bandgap, excellent radiation resistance, thermal conductance, strong bonding force, etc. thereof. The Group III nitride finds its application in the blue, green, and ultraviolet light emitting elements as well as high power, high frequency or high temperature element. Presently, the Group III nitride with widespread application includes Aluminum nitride (AlN), gallium nitride (GaN), aluminum gallium nitride (AlGaN), indium nitride (InN) and the mixed crystallization of them.

Conventionally, the majority of the semiconductor material applied in the industry comes in the form of bulk material. Alas, the cost of production for the large monocrystalline Group III nitride is too high, so the conventional way to manufacture electronic elements containing Group III nitride involves growing a film of Group III nitride via heteroepitaxy and then using the film as the substrate for the growth of other material. The common substrate for the initial heteroepitaxy includes sapphire, silicon carbide (SiC) and silicon; however the lattice constant and the thermal expansion coefficient of the Group III nitride and the aforementioned substrate materials usually differ significantly, so various defects may be induced in the subsequent epitaxy growth, for instance, the threading dislocations, stacking faults, etc. These defects may cause the indirect recombination center to introduce unwanted energy levels in the bandgap, thus reducing the life of the charge carrier. Besides the imperfection may increase the threshold voltage and reduce the thermal conductivity of the electronic elements. So, it is desirable to bring down the imperfection density of the Group III nitride induced during the heteroepitaxy growth in order to achieve higher luminous efficiency.

There are various means to reduce the imperfection density; one of the means is the epitaxial lateral overgrowth (ELOG). The ELOG reduces the dislocation density of the Group III nitride by growing the Group III nitride on the micro-stripe patterned epitaxial substrate to form a uniform emissive layer. However, different pattern will produce significantly different results with respect to the fabrication process and the subsequent crystal growth. As the result, the present invention aims to design a pattern to minimize the dislocation density of the Group III nitride.

The above information disclosed in this Background section is only for enhancement of understanding of the background of the invention and therefore it may contain information that does not form the prior art that is already known in this country to a person of ordinary skill in the art.

SUMMARY OF THE INVENTION

In light of the technical problems presented, the present invention aims to provide a method for growing the Group III nitride in order to reduce the dislocation density thereof.

In accordance with the objective of the present invention, a method for growing Group III nitride is provided, which includes the following steps. A plurality of notches separated from each other are formed at the epitaxial substrate surface via the pattering process. The plurality of notches each has at least one stepping structure with a predetermined inclination angle, wherein the stepping structure in each notch gradually descends towards the center of the corresponding notch. The Group III nitride is grown on the epitaxial substrate via epitaxy process. Wherein, the Group III nitride growing at an upper portion of the epitaxial substrate restricts the vertical growth of the Group III nitride growing at the lower portion of the epitaxial substrate, and the Group III nitride growing at the lower portion of the epitaxial substrate promotes the lateral growth of the Group III nitride growing at the upper portion of the epitaxial substrate.

Preferably, the stepping structure in each notch may be mutually symmetric with respect to a central axis of the corresponding notch.

Preferably, the epitaxial substrate may include sapphire substrate, silicon substrate, gallium nitride substrate, aluminum nitride substrate, silicon carbide substrate, transparent substrate or lens.

Preferably, each of the plurality of notches may further include a plurality of stepping structures having a plurality of predetermined inclination angles, and the plurality of predetermined inclination angles are either equal or unequal.

Preferably, the epitaxy process may include a chemical vapor deposition process or a physical vapor deposition process.

Preferably, for the chemical vapor deposition process, the reaction temperature may be approximately 1000 to 1650° C., and the reaction pressure may be approximately 10 to 500 mbar.

Preferably, the Group III nitride may include aluminum indium gallium nitride, aluminum indium nitride, indium gallium nitride, aluminum gallium nitride, aluminum nitride, gallium nitride or indium nitride.

Preferably, the width of the plurality of notches may be approximately 0.5 to 5 µm while the depth of the plurality of notches may be approximately 0.1 to 1.0 µm; the maximal values of the width and the depth increase as the number of the at least one stepping structures increases.

Preferably, after the step of growing the Group III nitride on the epitaxial substrate via epitaxy process, may further comprise a step of separating the epitaxial substrate and a film formed from the Group III nitride via laser lift-off (LLO).

Preferably, the separation spacing for the plurality of notches may be approximately 0.001 to 1 µm.

DESCRIPTION OF THE PREFERRED EMBODIMENTS

Figure 1:
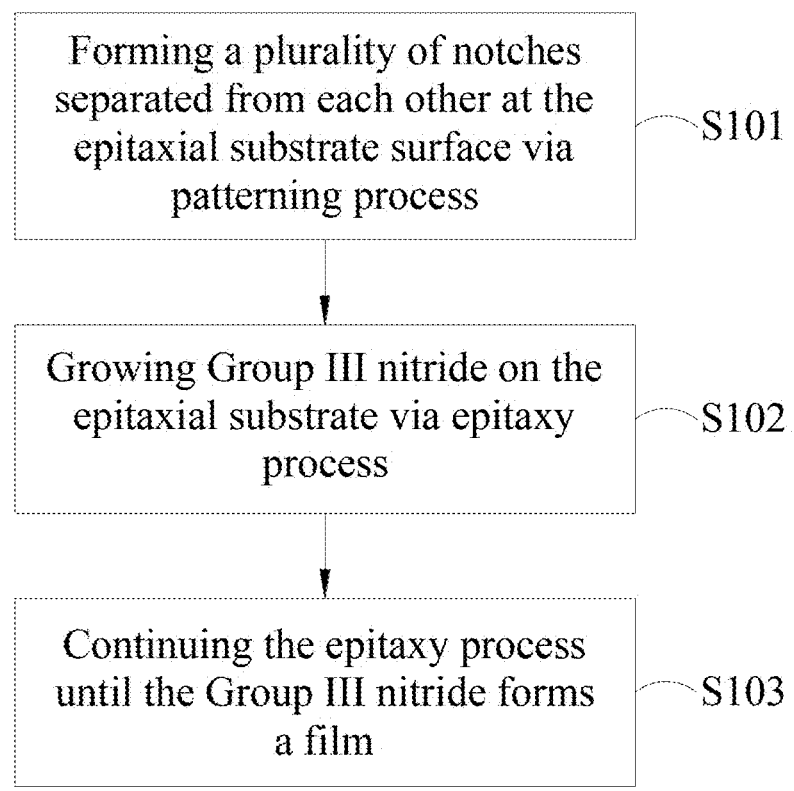
FIG. 1 is the flow chart illustrating the steps for growing Group III nitride on the epitaxial substrate with patterned structure according to the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

As used herein, the term "and/or" includes any and all combinations of one or more of the associated listed items. The term "at least one" prefixing a list of items modifies all the items in the list instead of the individual item(s) in the list.

Figure 2A:
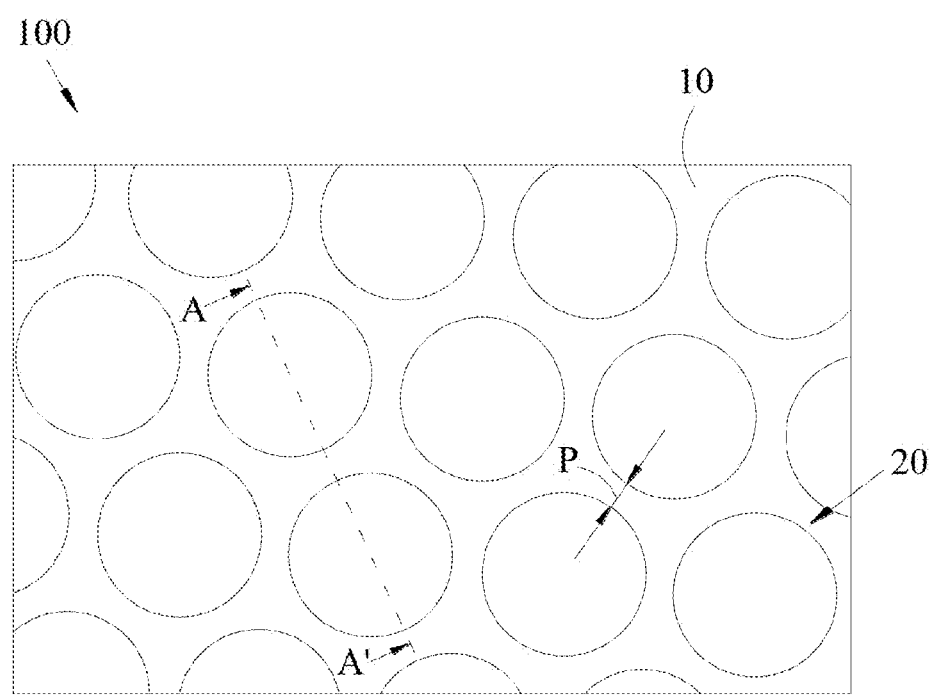
FIG. 2A is the top view of the epitaxial substrate with patterned structure according to the first embodiment of the present invention.

Refer to the FIG. 1 which is the flow chart illustrating the steps for growing Group III nitride on the epitaxial substrate with patterned structure according to the present invention, each and every step of the method will be set forth in detail along with reference to the appended drawings FIGS. 2A to 4 in the context below:

Step S101: Form a plurality of notches separated from each other at the epitaxial substrate surface via the patterning process. FIG. 2A shows the top view of the epitaxial substrate with patterned structure according to the first embodiment of the present invention. As shown in the FIG. 2A, a plurality of notches 20 are formed on the epitaxial substrate surface 10 of the first epitaxial substrate 100, each of the notches 20 may have at least one stepping structure 21 with a predetermined inclination angle, and the stepping structure 21 gradually descends towards the center of the corresponding notch 20. In the present embodiment, the first epitaxial substrate 100 can be sapphire substrate, silicon substrate, gallium nitride substrate, aluminum nitride substrate, silicon carbide substrate, transparent substrate or lens, but the invention is not limited thereto. The notches 20 are arranged on the epitaxial substrate surface 10 in a staggered manner similar to the matrix formation while being separated from each other by separation spacing P. The separation spacing P may range from approximately 0.001 μm to 1 μm, wherein the separation spacing P is adjustable according to the width or height of the notches 20 such that the Group III nitride has enough space for vertical growth. The patterning process may include Nanoimprint Lithography or exposure and development process. The Group III nitride may include aluminum indium gallium nitride, aluminum indium nitride, indium gallium nitride, aluminum gallium nitride, aluminum nitride, gallium nitride or indium nitride.

Figure 2B:
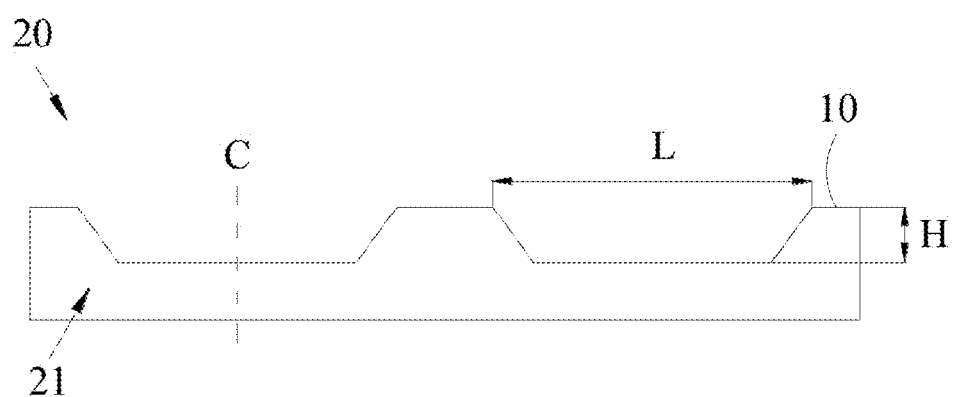
FIG. 2B is the sectional view of the epitaxial substrate with patterned structure in the FIG. 2A taken along the line A-A'.

Refer to FIG. 2B, the notches 20 have the width L which ranges from approximately 0.5 to 5 μm as well as the depth H which ranges from approximately 0.1 to 1.0 μm. Besides, the notches 20 have the stepping structures 21 with a predetermined inclination angle, but the invention is not limited thereto. Besides, the stepping structures 21 in each notch 20 are mutually symmetric with respect to a central axis C of the corresponding notch 20. With the aforementioned configuration, the epitaxy growth rate at both sides of the notch 20 will be equal, thus minimizing the time required for the epitaxy process.

Figure 3:
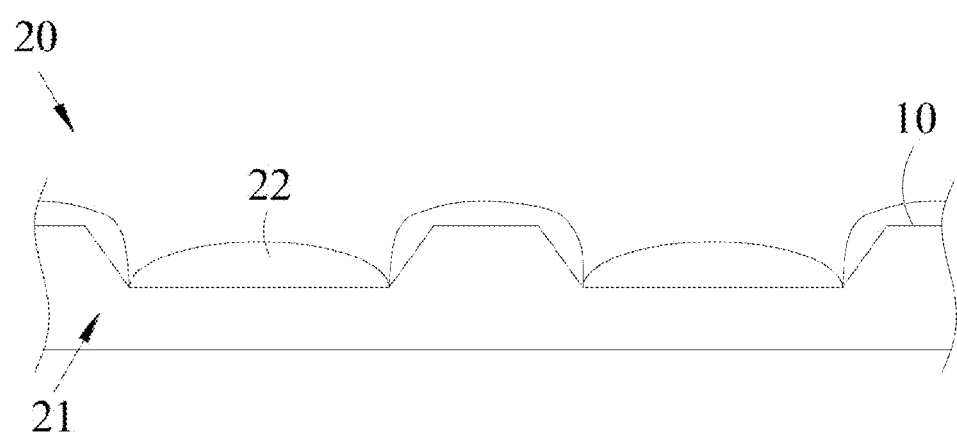
FIG. 3 is the sectional view illustrating the epitaxial substrate with patterned structure undergoing the initial film formation process according to the first embodiment of the present invention.

Step S102: Grow Group III nitride on the epitaxial substrate via epitaxy process. FIG. 3 is the sectional view illustrating the epitaxial substrate with patterned structure undergoing the initial film formation process according to the first embodiment of the present invention. As shown in the figure, the Group III nitride 22 is deposited on the epitaxial substrate surface 10 and the notch 20 which exhibits a relative height difference due to the configuration of the stepping structure 21, the impact of the relative height difference on the epitaxy growth will be clarified in the context hereinafter.

Figure 4:
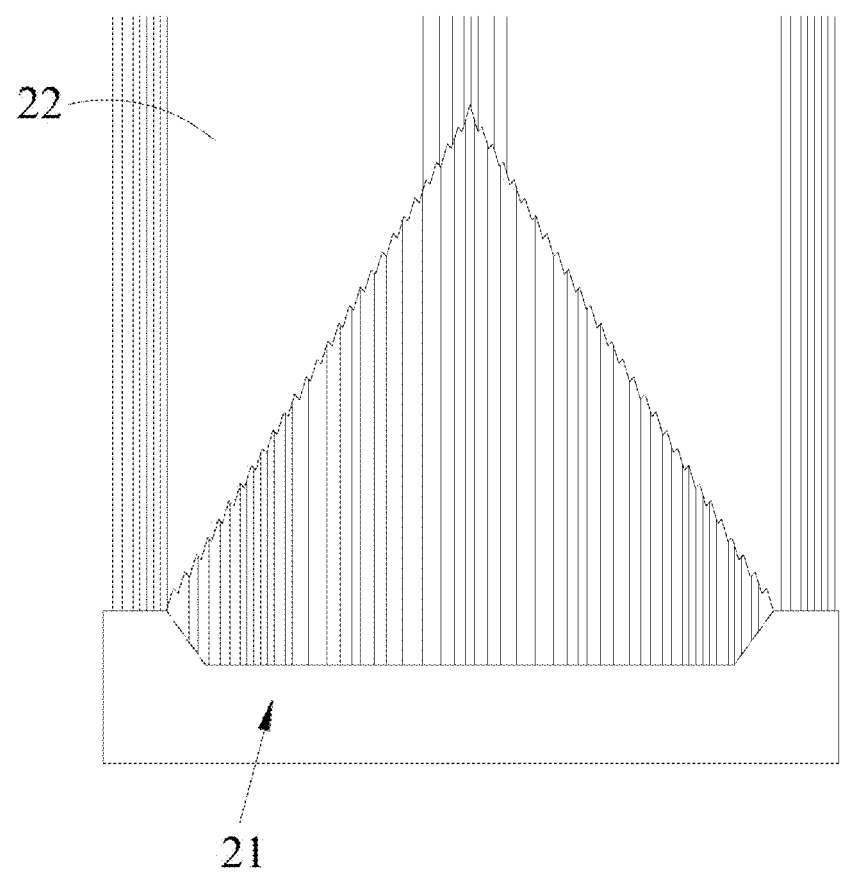
FIG. 4 is the sectional view illustrating the epitaxial substrate with patterned structure that had completed the film formation process according to the first embodiment of the present invention.

Step S103: Continue the epitaxy process until the Group III nitride forms a layer. FIG. 4 is the sectional view illustrating the epitaxial substrate with patterned structure that had completed the film formation process according to the first embodiment of the present invention. As can be appreciated in the figure, due to the relative height difference of the Group III nitride 22 caused by the stepping structure 21, the lateral growth of the Group III nitride 22 at the upper portion of the epitaxial substrate restricts the vertical growth of the Group III nitride 22 at the lower portion. As the result, a triangle is formed and the dislocation count above the lower portion of the epitaxial substrate is reduced.

Figure 5:
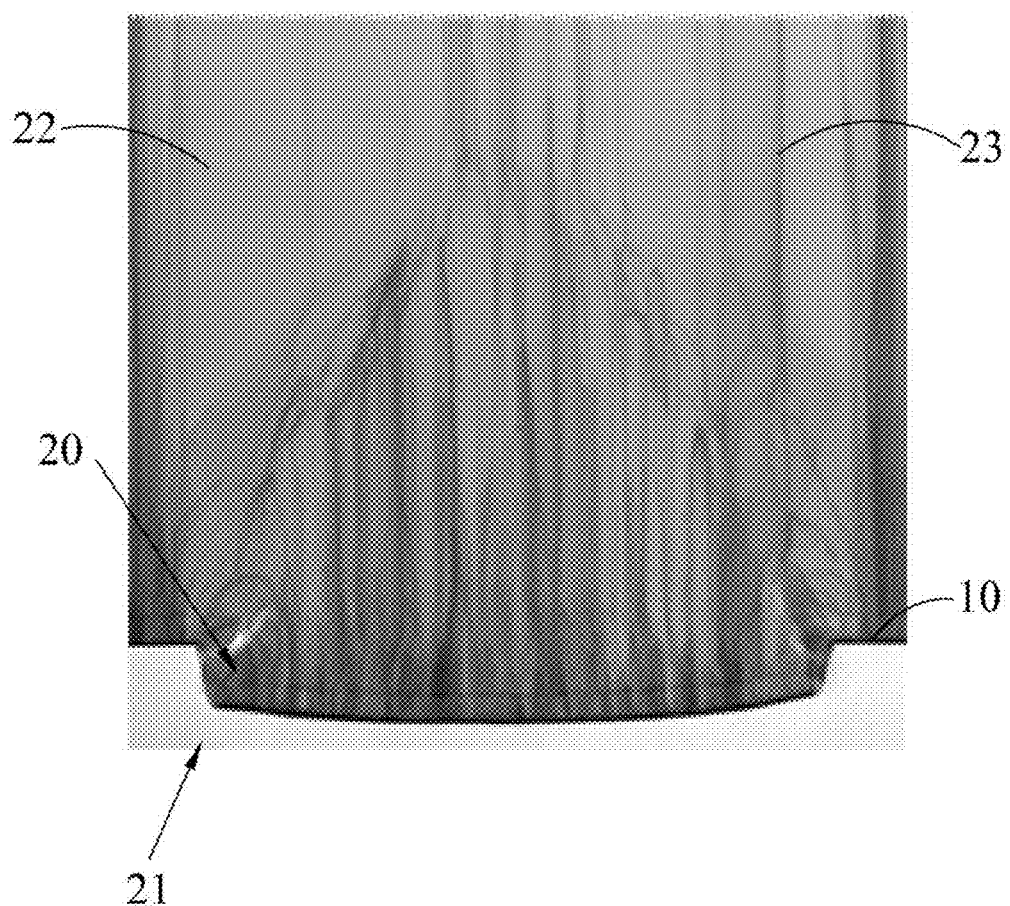
FIG. 5 is the electron micrograph of the epitaxial substrate with patterned structure according to the preferred embodiment of the present invention.

FIG. 5 is the electron micrograph of the epitaxial substrate with patterned structure according to the preferred embodiment of the present invention. As shown in the figure, the Group III nitride 22 growing vertically from the notch 20 at the lower portion is restricted by the lateral growth of the Group III nitride 22 growing at both sides of the epitaxial substrate surface 10 at the upper portion. Therefore, the vertical growth from the notch 20 gradually narrows as the epitaxy process progresses until a triangle is formed; the dislocations 23 in the triangle are unable to extend upwards due to the restriction imposed by the lateral growth of the Group III nitride 22 at the upper portion, as shown in FIG.

5. The dislocations 23 on top of the triangle are formed during the coalescence of the Group III nitride 22 growing laterally from the epitaxial substrate surface 10 at both sides of the notch 20, which takes place at the top portion of the triangle. The configuration of the epitaxial substrate of the present invention is capable of reducing the dislocations 23 above the notch 20 since there is no dislocation 23 in the Group III nitride 22 growing laterally, thereby reducing the overall dislocation density of the film formed from the Group III nitride 22.

Figure 6:
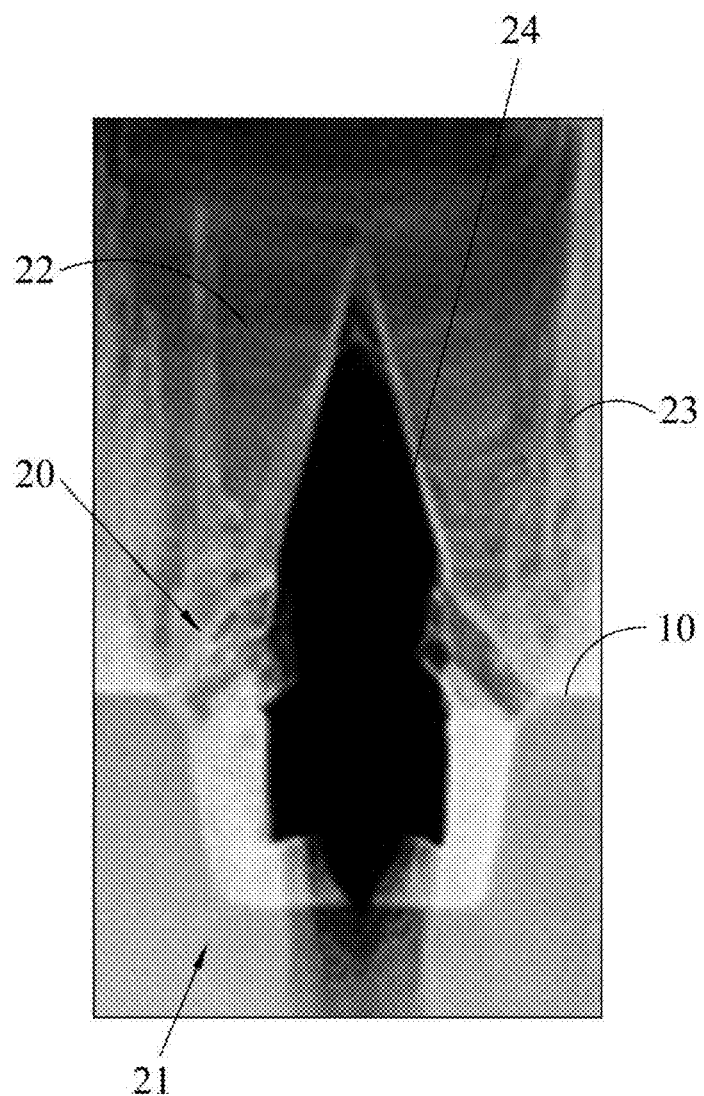
FIG. 6 is the electron micrograph of the epitaxial substrate with patterned structure according to another preferred embodiment of the present invention.

Refer to FIG. 6 which is the electron micrograph of the epitaxial substrate with patterned structure according to another preferred embodiment of the present invention. The drawing clearly suggests that the Group III nitride 22 growing from the inclined stepping structure 21 impedes the deposition of the Group III nitride 22 inside the notch 20 due to the small width of the notch 20, thus forming a hollow space 24. As can be observed in FIG. 6, the growth of the Group III nitride 22 from the stepping structure 21 is capable of promoting the lateral growth of the Group III nitride 22 on the epitaxial substrate surface 10 at both sides, which makes way for the coalescence at the central axis C on the notch 20, thereby reducing the overall dislocation density of the film formed from the Group III nitride 22.

Figure 7A:
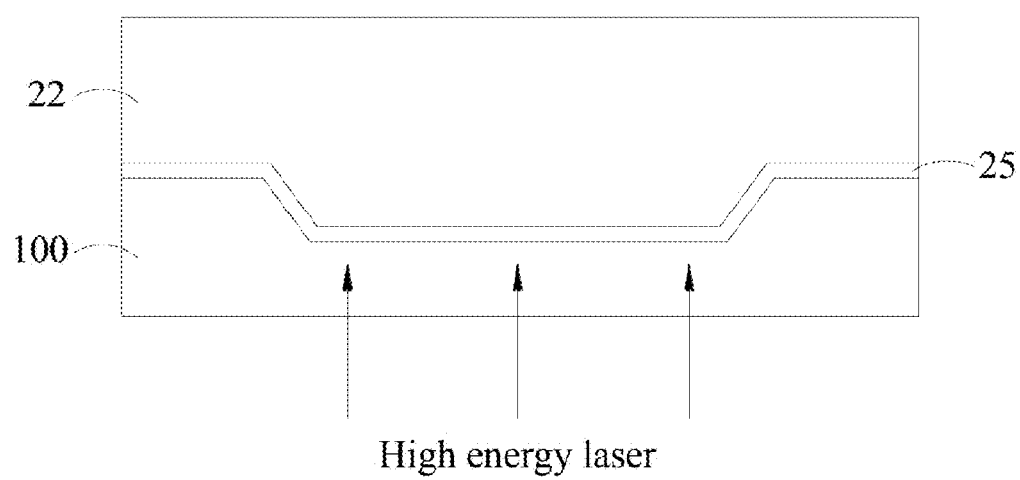
FIGS. 7A and 7B are the schematic diagrams illustrating the laser lift-off on the epitaxial substrate with patterned structure according to the present invention.
Figure 7B:
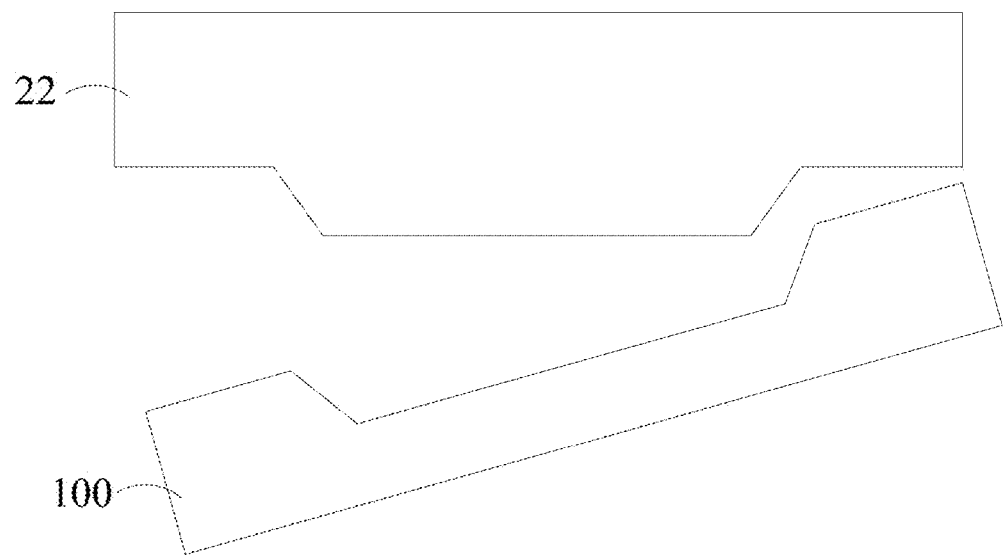

Refer to the FIGS. 7A and 7B, which are the schematic diagrams illustrating the laser lift-off (LLO) on the epitaxial substrate with patterned structure according to the present invention. As shown in the FIG. 7A, a high energy laser can penetrate the first epitaxial substrate 100 since the first epitaxial substrate 100 permits the passage of high energy laser without absorbing the energy thereof. When the penetrated laser reaches the Group III nitride 22, the Group III nitride 22 will absorb the energy of the laser beam and undergo thermal decomposition at the heat receiving interface 25. The Group III nitride 22 at the heat receiving interface 25 will decompose into metal and nitrogen gas, thus separating the first epitaxial substrate 100 and the Group III nitride 22, as shown in the FIG. 7B.

Figure 8:
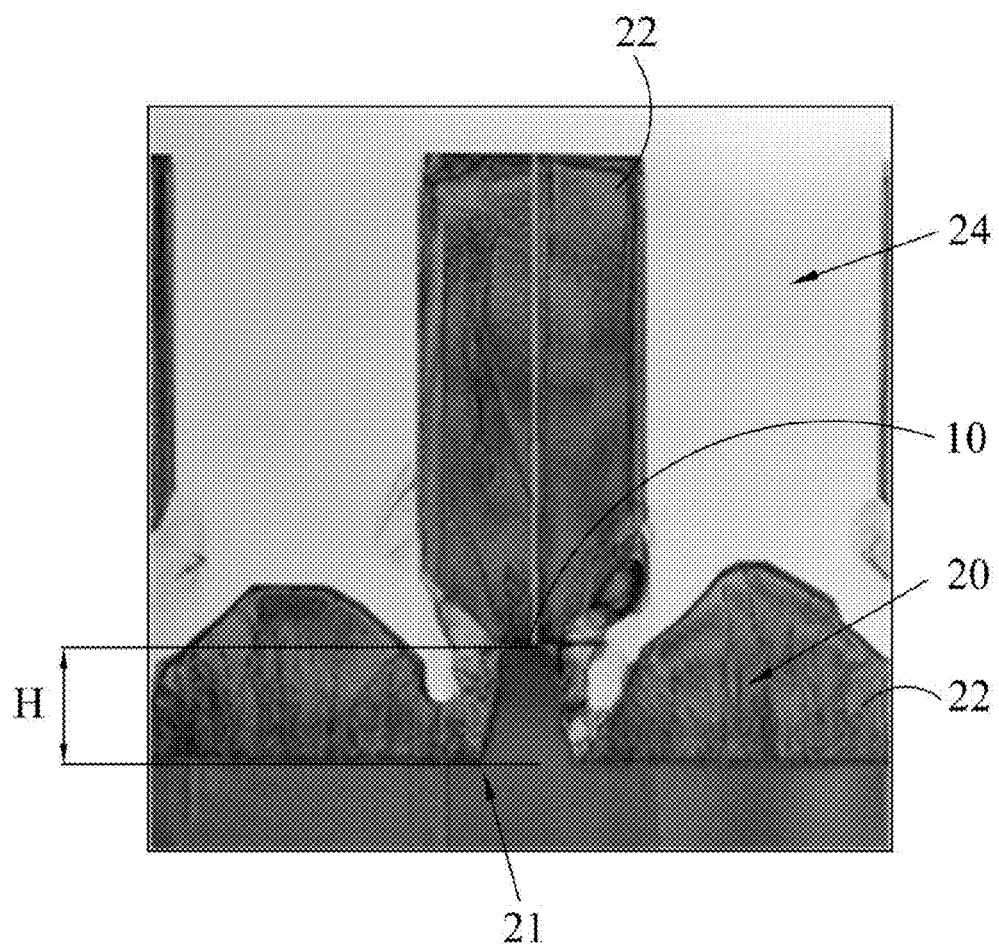
FIG. 8 is the electron micrograph of the epitaxial substrate with patterned structure according to the comparative embodiment of the present invention.

FIG. 8 is the electron micrograph of the epitaxial substrate with patterned structure according to the comparative embodiment of the present invention. As shown in the figure, since the depth of the notch 20 is too great, i.e. exceeds 0.7 µm, the Group III nitride 22 growing vertically from the notch 20 fails to coalesce with the Group III nitride 22 growing from the epitaxial substrate surface 10; as the result the subsequent lateral growth of the Group III nitride 22 growing from the epitaxial substrate surface 10 is stunted and the Group III nitride 22 turns to growing vertically instead. The vertical growth of the Group III nitride 22 impedes the deposition process in the notch 20, causing the Group III nitride 22 in the notch 20 to fail to grow vertically to the desired height and hence a hollow space 24 is formed. As can be appreciated from the FIG. 8, the coalescence between the Group III nitride 22 growing vertically from the notch 20 and the Group III nitride 22 growing laterally from the epitaxial substrate surface 10 provides substantial contribution to the lateral growth of the Group III nitride 22 growing from the epitaxial substrate surface 10. In other words, the lateral growth of the Group III nitride 22 growing from the epitaxial substrate surface 10 is sustainable as long as there is coalescence between the Group III nitride 22 growing from the notch 20 and the epitaxial substrate surface 10. In contrast, if the depth H of the notch 20 is too great for the coalescence between the Group III nitride 22 growing from the notch 20 and the epitaxial substrate surface 10 to take place, the Group III nitride 22 will stop growing laterally from the epitaxial substrate surface 10 and start growing vertically instead.

Figure 9A:
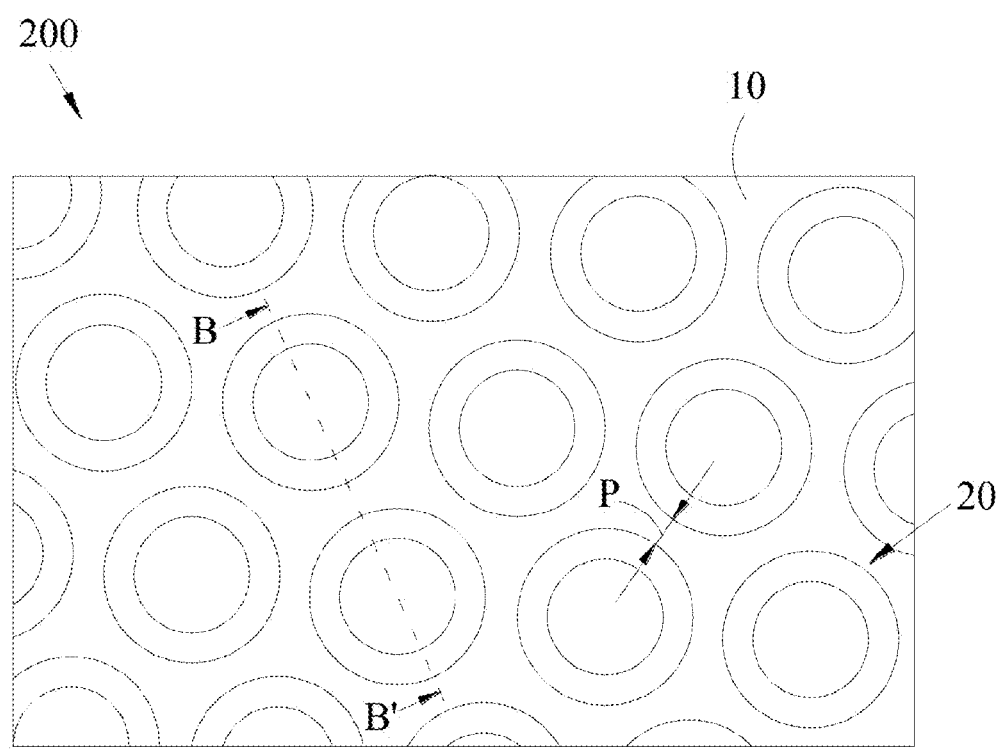
FIG. 9A is the top view of the epitaxial substrate with patterned structure according to the second embodiment of the present invention.

FIG. 9A is the top view of the epitaxial substrate with patterned structure according to the second embodiment of the present invention. As shown in the figure, similar to the first epitaxial substrate 100, the second epitaxial substrate 200 includes a plurality of notches 20 with the separation spacing P; the difference is that the plurality of notches 20 are respectively disposed with a plurality of stepping structures 21. The detailed descriptions of the configuration of the stepping structures will be given hereinafter. Similarly, the patterning process for the notches 20 may include Nanoimprint Lithography or exposure and development process.

Figure 9B:
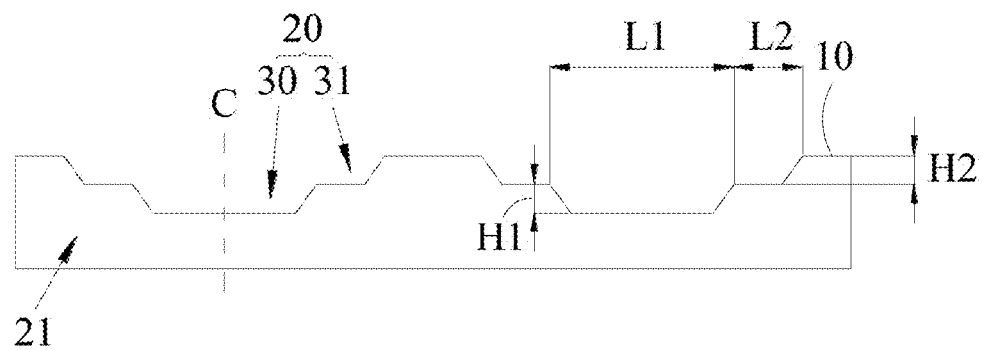
FIG. 9B is the sectional view of the epitaxial substrate with patterned structure in the FIG. 9A taken along the line B-B'.

FIG. 9B is the sectional view of the epitaxial substrate with patterned structure in the FIG. 9A taken along the line B-B'. As shown in the figure, each notch 20 has a plurality of stepping structures 21 with different predetermined inclination angle, the stepping structures 21 are mutually symmetric with respect to the central axis C of the corresponding notch 20, but the invention is not limited thereto. It is apparent from the FIG. 9B that the stepping structures 21 cooperatively form a layered structure which includes a central notch 30 with width L1 and depth H1 as well as a stage 31 with width L2 and depth H2. In other words, the notch 20 is formed from the central notch 30 and the stage 31; wherein, there is an optimal ratio between the widths and depths L1, H1 and L2, H2, the ratio ranges from approximately 0.7 to 50 depending on the reaction condition of the epitaxy process, but the invention is not limited thereto. With the aforementioned structure, the total depth of the notch 20 may increase as the number of layers increases, such that practical design requirements are met, since the depth may be evenly distributed among every layer. Therefore, the failure to coalesce between the Group III nitride growing at the upper portion and the lower portion due to the exceeding depth (>0.7 µm) as illustrated in the FIG. 8 may be avoided. Meanwhile, since there is an optimal ratio between the width and the depth, the total width increases as the total depth increases, as the result the ratio of area occupied by the notches 20 on the epitaxial substrate with respect to that on the epitaxial substrate surface 10 increases as well. Since the dislocation count of the Group III nitride growing on the notches 20 is significantly lower than that of the Group III nitride growing on the epitaxial substrate surface 10, the overall dislocation density of the film formed from the Group III nitride may be reduced. Wherein, the Group III nitride may include aluminum indium gallium nitride, aluminum indium nitride, indium gallium nitride, aluminum gallium nitride, aluminum nitride, gallium nitride or indium nitride.

Figure 10:
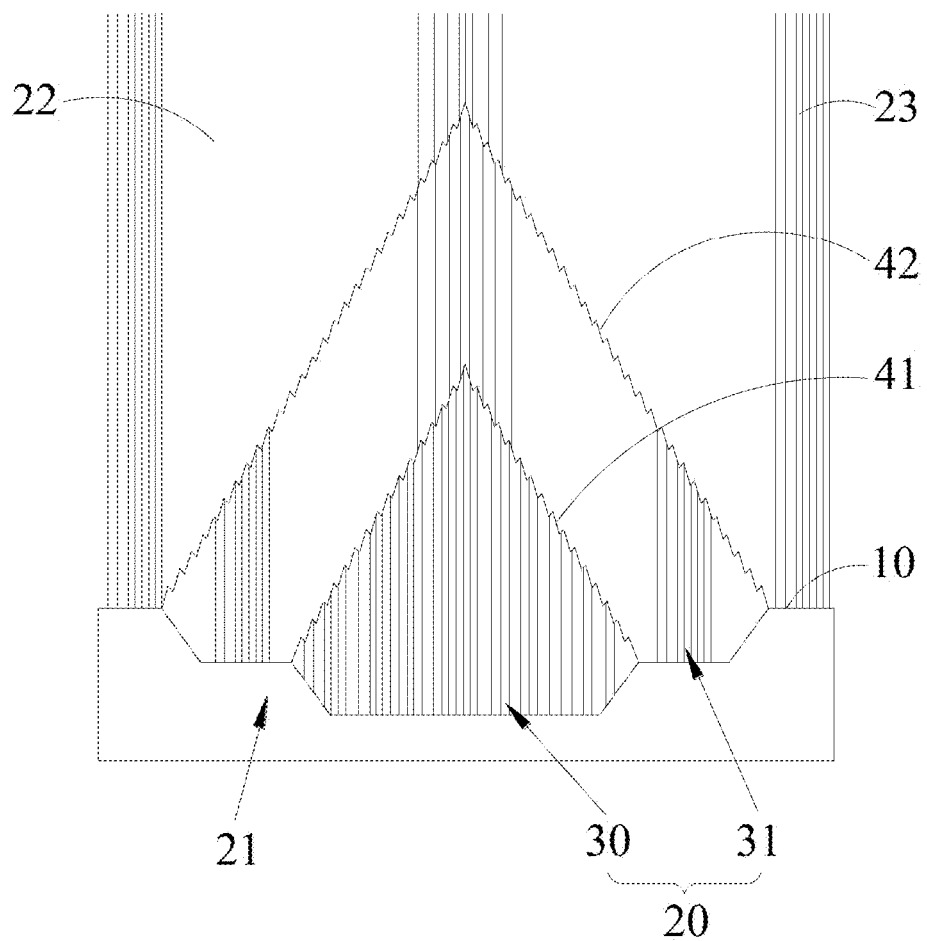
FIG. 10 is the sectional view illustrating the epitaxial substrate with patterned structure that had completed the film formation process according to the second embodiment of the present invention.

FIG. 10 is the sectional view illustrating the epitaxial substrate with patterned structure that had completed the film formation process according to the second embodiment of the present invention. As shown in the figure, the Group III nitride 22 growing vertically from the central notch 30 is restricted by the lateral growth of the Group III nitride 22 growing from the stages 31, and gradually narrows as the epitaxy process progresses until a first triangle 41 is formed. In the meantime, the Group III nitride 22 growing vertically from the stages 31 is also restricted by the lateral growth of the Group III nitride 22 growing from the epitaxial substrate surface 10 and gradually narrows as the epitaxy process progresses until a second triangle 42 is formed. The Group III nitride 22 growing laterally from the stages 31 and the epitaxial substrate surface 10 respectively coalesce at the top portion of the first triangle 41 and the second triangle 42, forming a small amount of dislocations 23. With the structure, the depth can be evenly distributed among the layers despite the increment of total depth of the notch 20. Therefore, the vertical growth of the Group III nitride 22 from the central notch 30 and the stage 31 are capable of promoting the lateral growth of the Group III nitride 22 from the stage 31 and the epitaxial substrate surface 10 respectively, culminating in the coalescence of the Group III nitride 22 above the central axis. As the result the total width of the notch 20 increases and the overall dislocation density of the film formed from the Group III nitride 22 may be reduced.

Figure 11:
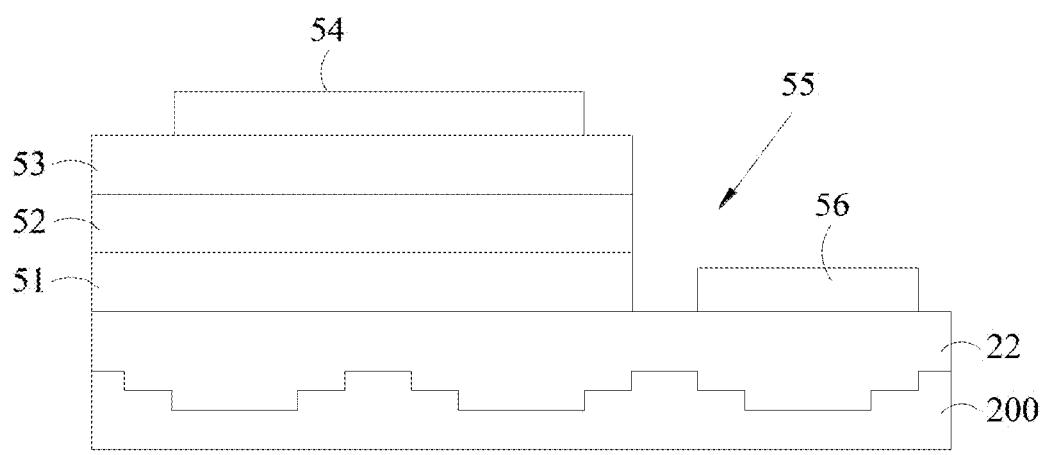
FIG. 11 is the sectional view of the light emitting diode on the epitaxial substrate with patterned structure according to the second embodiment of the present invention.

FIG. 11 is the sectional view of the light emitting diode on the epitaxial substrate with patterned structure according to the second embodiment of the present invention. As can be appreciated in the figure, the light emitting diode (LED) includes the second epitaxial substrate 200 and the Group III nitride 22 growing thereon, as well as the N-type semiconductor layer 51, active layer 52, P-type semiconductor layer 53, P side electrode 54 and the N side electrode 56 grown sequentially above the Group III nitride 22. Wherein, the N side electrode 56 is disposed in a recessed region 55 which may be formed via the Reactive-ion etching, laser ablation, powder-blasting or chemical etching after the growth of the N-type semiconductor layer 51, active layer 52 and the P-type semiconductor layer 53, but the invention is not limited thereto. Since the present invention reduces the dislocation count of the Group III nitride 22, the dislocation count of the active layer 52 grown above the Group III nitride 22 may be reduced as well, and the LED may achieve higher luminous efficiency.

In conclusion, with the method for growing the Group III nitride of the present invention, the lateral growth of the Group III nitride at the upper portion of the epitaxial substrate will restrict the vertical growth of the Group III nitride at the lower portion of the epitaxial substrate; in addition the vertical growth of the Group III nitride at the lower portion of the epitaxial substrate will promote the lateral growth of the Group III nitride at the upper portion of the epitaxial substrate. This feature in conjunction with the configuration of the notch and stepping structure aforementioned may form the Group III nitride with lower dislocation density. Besides, by distributing the depth evenly among every layer, the total width of the notch can be maximized, which further reduces the overall dislocation density of the film formed from the Group III nitride, thus promoting the quality of the film formed.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A method for growing Group III nitride, comprising steps as follows:
    forming a plurality of notches separated from each other at an epitaxial substrate surface via a pattering process, the plurality of notches each having at least one stepping structure with a predetermined inclination angle, wherein the at least one stepping structure in each notch gradually descends towards a center of the corresponding notch; and
    growing a Group III nitride on an epitaxial substrate via epitaxy process;
    wherein, the Group III nitride growing at an upper portion of the epitaxial substrate restricts a vertical growth of the Group III nitride growing at a lower portion of the epitaxial substrate, and the Group III nitride growing at the lower portion of the epitaxial substrate promotes a lateral growth of the Group III nitride growing at the upper portion of the epitaxial substrate;
    wherein each of the plurality of notches further comprises a plurality of stepping structures.

2. The method for growing Group III nitride of claim 1, wherein the at least one stepping structure in each notch is mutually symmetric with respect to a central axis of the corresponding notch.

3. The method for growing Group III nitride of claim 1, wherein the epitaxial substrate comprises sapphire substrate, silicon substrate, gallium nitride substrate, aluminum nitride substrate, silicon carbide substrate, transparent substrate or lens.

4. The method for growing Group III nitride of claim 1, wherein the plurality of stepping structures have a plurality of predetermined inclination angles, and the plurality of predetermined inclination angles are equal.

5. The method for growing Group III nitride of claim 1, wherein the plurality of stepping structures have a plurality of predetermined inclination angles, and the plurality of predetermined inclination angles are not equal.

6. The method for growing Group III nitride of claim 1, wherein epitaxy process comprises a chemical vapor deposition process or a physical vapor deposition process.

7. The method for growing Group III nitride of claim 6, wherein for the chemical vapor deposition process, a reaction temperature is approximately 1000 to 1650° C., and a reaction pressure is approximately 10 to 500 mbar.

8. The method for growing Group III nitride of claim 1, wherein the Group III nitride comprises aluminum indium gallium nitride, aluminum indium nitride, indium gallium nitride, aluminum gallium nitride, aluminum nitride, gallium nitride or indium nitride.

9. The method for growing Group III nitride of claim 1, wherein a width of the plurality of notches is approximately 0.5 to 5 μm while a depth of the plurality of notches is approximately 0.1 to 1.0 μm; maximal values of the width and the depth increase as a number of the at least one stepping structures increases.

10. The method for growing Group III nitride of claim 1, wherein after a step of growing the Group III nitride on the epitaxial substrate via epitaxy process, further comprises a step of separating the epitaxial substrate and a film formed from the Group III nitride via laser lift-off (LLO).

11. The method for growing Group III nitride of claim 1, wherein a separation spacing for the plurality of notches is approximately 0.001 to 1 μm.

* * * * *